(12) United States Patent
Lin et al.

(10) Patent No.: US 11,500,017 B1
(45) Date of Patent: Nov. 15, 2022

(54) TESTING MEMORY ELEMENTS USING AN INTERNAL TESTING INTERFACE

(71) Applicant: XILINX, INC., San Jose, CA (US)

(72) Inventors: Albert Shih-Huai Lin, Mountain View, CA (US); Amitava Majumdar, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 17/216,516

(22) Filed: Mar. 29, 2021

(51) Int. Cl.
| | | |
|---|---|---|
| *G01R 31/3177* | (2006.01) | |
| *G11C 29/32* | (2006.01) | |
| *G01R 31/317* | (2006.01) | |
| *G11C 7/22* | (2006.01) | |
| *G01R 31/28* | (2006.01) | |
| *G06F 11/36* | (2006.01) | |
| *G01R 31/3185* | (2006.01) | |
| *G01R 31/319* | (2006.01) | |
| *G06F 11/273* | (2006.01) | |
| *G11C 29/12* | (2006.01) | |

(52) U.S. Cl.
CPC ... *G01R 31/3177* (2013.01); *G01R 31/31726* (2013.01); *G11C 29/32* (2013.01); *G01R 31/2884* (2013.01); *G01R 31/31725* (2013.01); *G01R 31/31922* (2013.01); *G01R 31/318541* (2013.01); *G01R 31/318552* (2013.01); *G01R 31/318566* (2013.01); *G01R 31/318594* (2013.01); *G06F 11/2733* (2013.01); *G06F 11/36* (2013.01); *G06F 11/3656* (2013.01); *G06F 11/3664* (2013.01); *G11C 7/222* (2013.01); *G11C 29/12015* (2013.01)

(58) Field of Classification Search
CPC .. G06F 11/36; G06F 11/2733; G06F 11/3656; G06F 11/3664; G11C 29/12015; G11C 29/32; G11C 7/222; G01R 31/318566; G01R 31/318594; G01R 31/318552; G01R 31/2884; G01R 31/318541; G01R 31/31725; G01R 31/31922; G01R 31/3177; G01R 31/31726
See application file for complete search history.

(56) References Cited

U.S. PATENT DOCUMENTS

| | | | |
|---|---|---|---|
| 10,685,730 B1 * | 6/2020 | Shah | .............. G01R 31/3187 |
| 2006/0041802 A1 * | 2/2006 | Grise | ............. G01R 31/318555 714/724 |
| 2010/0017666 A1 * | 1/2010 | Otake | ............ G01R 31/318544 714/726 |
| 2016/0349320 A1 * | 12/2016 | Laisne | ............... G01R 31/2851 |

* cited by examiner

*Primary Examiner* — April Y Blair
*Assistant Examiner* — Sazzad Hossain
(74) *Attorney, Agent, or Firm* — Patterson + Sheridan, LLP

(57) ABSTRACT

A semiconductor device comprises a plurality of memory elements, test control circuitry, and a testing interface. The test control circuitry is configure to determine that one or more clock signals associated with the memory elements have been stopped and generate a scan clock signal based on the determination that the one or more clock signals have been stopped. The test control circuitry is further configured to communicate the scan clock signal to the memory elements. The testing interface is configured to communicate test data from the memory elements. In one example, the test data is delimited with start and end marker elements. The semiconductor device is mounted to a circuit board and is communicatively coupled to communication pins of the circuit board.

16 Claims, 11 Drawing Sheets

|  | 436 | 442 | 438 | 638 |
|---|---|---|---|---|
| 712 |  |  |  |  |
| 714 | 0 | 0 | x | x |
| 722 | 1 | x | x | 1 |
| 724 | 0 | 1 | 0 | x |
| 726 | 1 | 1 | 0 | 0 |
|  | 1 | 1 | 1 | 1 |

FIG. 7

TESTING MEMORY ELEMENTS USING AN INTERNAL TESTING INTERFACE

TECHNICAL FIELD

Examples of the present disclosure generally relate to debugging semiconductor devices using a testing interface.

BACKGROUND

The increasing complexity of semiconductor device (e.g., a system on chip (SOC) or other semiconductor device) designs is accompanied by a rise in the difficulty of performing a silicon debug process. In some instances, the increased complexity of the semiconductor device design leads to incomplete verification, validation, and/or test results when performing a debug process. In some debugging instances, memory and scan chain dumps are used to obtain large amounts of data that are observed to aid in a silicon debug process. However, communicating the large amount of data from the semiconductor device is time consuming and often requires a direct connection between a test device and the semiconductor device under test.

In field-programmable gate array (FPGA) SoC designs, a silicon debug process includes using elements of the FPGA for state observation. However, using the FPGA for state observation may change the configuration of the SoC design. The changes to the SoC design may cause the failure syndrome or the cause of the failure syndrome to disappear. Accordingly, in some FPGA SoC designs, the debugging processes may be inconclusive. In non-FPGA SoC designs (e.g., application specific integrated circuits (ASICS), central processing units (CPUs), and/or graphic processing units (GPUs)), the scan dump process uses chip-level pins. However, when a non-FPGA SoCs are mounted on a circuit board, in many instances, the pins required for test are not available.

Thus, there is a need for an improved testing process that does not alter the design under test and/or does not rely on unavailable chip-level pins.

SUMMARY

Examples described herein provide for a debugging various different types of semiconductor device designs. For example, a testing interface (e.g., an internal Joint Test Action Group (iJTAG) interface) is used to provide test data to and receive test data from a semiconductor device. The testing interface communicates with the semiconductor device while the semiconductor device is mounted on a circuit board. For example, the testing interface communicates test data to and from elements of the semiconductor device. Further, employing the testing interface to communicate with the semiconductor device allows for the semiconductor device to be debugged without modification of the field-programmable gate array (FPGA) and/or requiring access to unavailable chip-level pins.

In one example, a semiconductor device comprises a plurality of memory elements, test control circuitry, and a testing interface. The test control circuitry is configure to determine that one or more clock signals associated with the memory elements have been stopped and generate a scan clock signal based on the determination that the one or more clock signals have been stopped. The test control circuitry is further configured to communicate the scan clock signal to the memory elements. The testing interface is configured to communicate test data from the memory elements.

In one example, an electronic device comprises a circuit board comprising communication pins, and a semiconductor device mounted to the circuit board. The semiconductor device is communicatively coupled to the communication pins. The semiconductor device comprises a plurality of memory elements, test control circuitry, and a testing interface. The test control circuitry is configured to determine that one or more clock signals associated with the memory elements have been stopped, generate a scan clock signal based on the determination that the one or more clock signals have been stopped, and communicate the scan clock signal to the memory elements. The testing interface is configured to communicate test data from the memory elements.

In one example, a method for testing a semiconductor device comprises determining that one or more clock signals associated with memory elements have been stopped, and generating a scan clock signal based on the determination that the one or more clock signals have been stopped. The method further comprises communicating the scan clock signal to the memory elements, and communicating test data from the memory elements.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

FIG. 7 illustrates an example state table of a scan control sequencer circuitry according to some examples.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
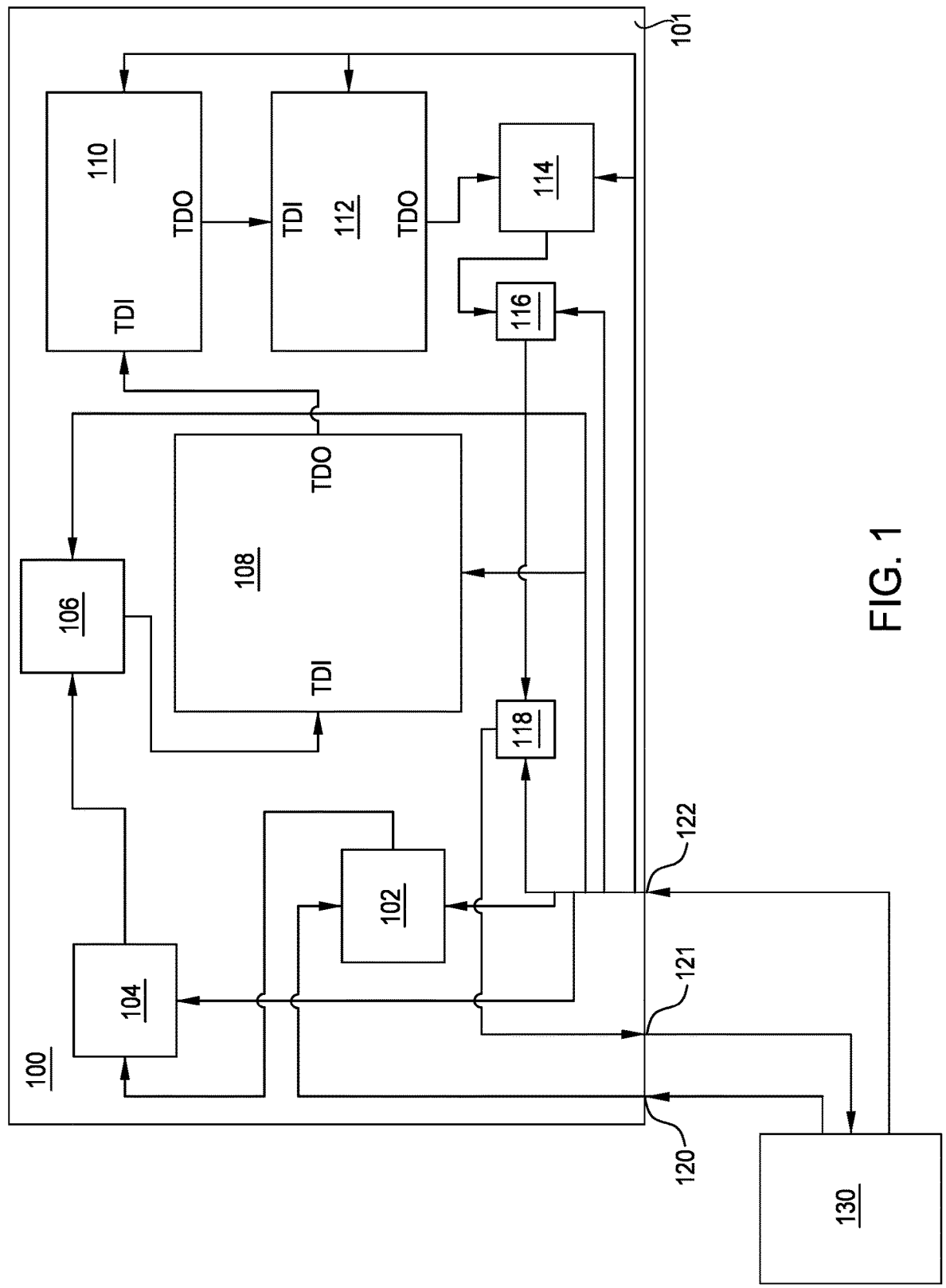
FIG. 1 is a block diagram depicting an example electronic device according to some examples.

Examples described in the following describe a debugging system that is able to debug various different types of semiconductor device designs. For example, a testing interface (e.g., an internal Joint Test Action Group (iJTAG) interface) is used to provide test data to and receive test data from an integrated circuit (IC). The semiconductor device may be a system on chip (SoC) or other type of IC. The testing interface is able to communicate with the semiconductor device while the semiconductor device is mounted on a circuit board. For example, the testing interface communicates test data to and from the semiconductor device for debugging of the semiconductor device. In examples where the semiconductor device under test is a field-programmable gate array (FPGA) semiconductor device, communicating with the semiconductor device via a testing interface allows for testing data to be provided to and received from the semiconductor device without modifying the FPGA. In examples where the semiconductor device under test is a not a FPGA semiconductor device, communicating with the semiconductor device via a testing interface allows for testing data to be provided to and received from the semiconductor device without requiring access to chip-level pins that may not be available. Accordingly, a semiconductor device that is mounted to a printed circuit board may be debugged via the testing interface without altering the semiconductor device and/or the connections between the semiconductor device and the circuit board.

The testing interface is utilized as a communication interface for debugging, and performing other tests on a semiconductor device mounted on a circuit board. For example, the testing interface communicates test data to and from memory blocks within the semiconductor device to determine the state of the memory blocks. The testing interface communicates with selected memory elements without modifying the semiconductor device design. Further, the testing interface is able to communicate with the selected memory elements without the use of chip-level pins. Accordingly, the chip-level pins utilized for debug may be omitted from the semiconductor device design, reducing the amount of semiconductor device design area utilized for pins used for test.

In examples where the testing interface is an iJTAG interface, the iJTAG interface communicates with different sets of memory elements within the semiconductor device to test the state of the different sets of memory elements. The iJTAG interface includes segment insertion bits (SIBs) that communicate with different sets of memory elements. For example, an SIB connects a test data in (TDI) pin of the iJTAG interface with a set of memory elements to provide test data to the set of memory elements. Further, an SIB connects a test data out (TDO) of the iJTAG interface to a set of memory elements to readout resultant test data corresponding to the state of the memory elements. Polling circuitry is electrically connected to the iJTAG interface and the memory elements to ensure that the clock signals of the memory elements are stopped before the SIB communicates test data to the memory elements. Stopping the clock signals ensures that when the test data is provided to the memory elements, the state of the memory elements corresponds to the test data. For example, after stopping the clock signals of the memory elements, the clock signals of the memory elements are synchronized with the clock signal of the iJTAG interface. Test data is communicated to the set or sets of memory elements as a bitstream by the SIB. Data output by the memory elements is compared with expected test data to determine whether or not there are errors (bugs) within the memory elements. Multiple sets of memory elements may be connected together serially, forming a serially connected scan chain of memory elements (e.g., daisy chained memory elements). Each of the different sets of memory elements may be part of a different logic block within the semiconductor device. Connecting the multiple sets of memory elements allows for multiple sets of memory elements to be tested at the same time, decreasing the amount time needed to complete the test.

FIG. 1 illustrates an electronic device 100. The electronic device 100 includes one or more semiconductor devices (e.g., semiconductor devices 102-118) mounted on a circuit board 101. The circuit board 101 may be a printed circuit board. In one or more examples, the circuit board 101 is referred to as a substrate. Further, the electronic device 100 includes communication pins (e.g., terminals or connections) 120-122. The communication pins 120-122 allow for signals to be sent to the electronic device 100 and received from the electronic device 100.

Each of the semiconductor devices 102-118 is an integrated circuit. For example, any one or more of the semiconductor devices 102-118 is a Field Programmable Gate Array (FPGA) or an Application Specific Integrated circuit (ASIC). Any one or more of the semiconductor devices 102-118 may be a central processing unit (CPU), graphics processing unit (GPU), transmitter, receiver, encryption unit, and memory controller, among others. In one embodiment, a first one or more of the semiconductor devices 102-118 is an FPGA and a second one or more of the semiconductor devices 102-118 is an ASIC. In other embodiments, each of the semiconductor devices 102-118 is an FPGA or an ASIC. Further, one or more of the semiconductor devices 102-118 is a system on chip (SoC) including programmable portions and hard-wired portions.

The communication pins 120-122 provide a path for test interfaces within one or more of the semiconductor devices 102-118 to communicate with the test device 130. For example, one or more of the semiconductor devices 102-118 includes a test interface that receives test signals (i.e., test data) from the test device 130 via the communication pins 120-121. The test interface communicates resultant test signals to the test device 130 via the communication pins 120-121.

The testing (iJTAG) interface receives a clock control signal or signals, a test mode select signal or signals, and a test rest signal or signals from the test device 130 via the communication pin 122. In on example, test data and/or resultant test data is communicated from the testing interface of the semiconductor device 102 to the communication pin 121. Resultant test data is test data that is communicated from elements within a semiconductor device 102. For example, as will be described in greater detail in the following, test data configures one or more memory elements of a semiconductor device and the resultant test data is the output corresponding to configuration set by the test data.

The test data determines the state of one or more memory elements of the semiconductor device under test and the resultant test data is the output of the one or more memory elements. The test device 130 compares the resultant test data to the test data and the comparison may be used to determine if errors exists in the semiconductor device under test. For example, if the resultant test data and the test data do not match, a determination that one or more of the memory elements wasn't set to the test state is determined and those memory elements are identified as being a fault or erroneous.

The semiconductor devices 102-118 are connected to each other via one or more connections. The one or more connections are used to communicate one or more of test signals and resultant test signals between semiconductor devices 102-118. For example, the semiconductor device 102 receives test data from the communication pin 120 and communicates test data and/or resultant test data to the semiconductor device 104. The semiconductor devices 104-118 may generate additional resultant test data from the test data and/or communicate the resultant test data of the semiconductor device 104 to the communication pin 121. The semiconductor device 102 may receive test data from the communication pin 120 and communicates the test data unprocessed to the semiconductor device 104. The test data and/or resultant test data is serially communicated from the communication pin 120, between the semiconductor devices 102-118 and the communication pin 121.

The controls signals provided via the communication pin 122 from the test device 130 are communicated in parallel to each of the semiconductor devices 102-118. While FIG. 1 illustrates that the control signals are provided via a single communication pin 122, in other embodiments, a first control signal (e.g., a clock signal may be provided via the communication pin 122 and a second control signal (e.g., a test mode select signal) may be communicated via another communication pin.

The test device 130 is electrically connected to communication pins 120-122 of the electronic device 100. The test device 130 communicates test data to the communication pin 120, receives resultant test data via the communication pin 121, and communicates the control signals to the communication pin 122. The test device 130 generates the test data. Further, the test device 130 processes the resulting test data to determine the functionality of elements of one or more of the semiconductor devices 102-118. For example, the test device 130 compares the test data with the resultant test data to determine whether or not errors (bugs) exist in the memory elements of the semiconductor device or devices. When the resultant test data and the test data do not match, the semiconductor device under test is determined to have one or more errors. When the resultant test data and the test data match, the semiconductor device under test is determined to be free from errors.

Figure 2:
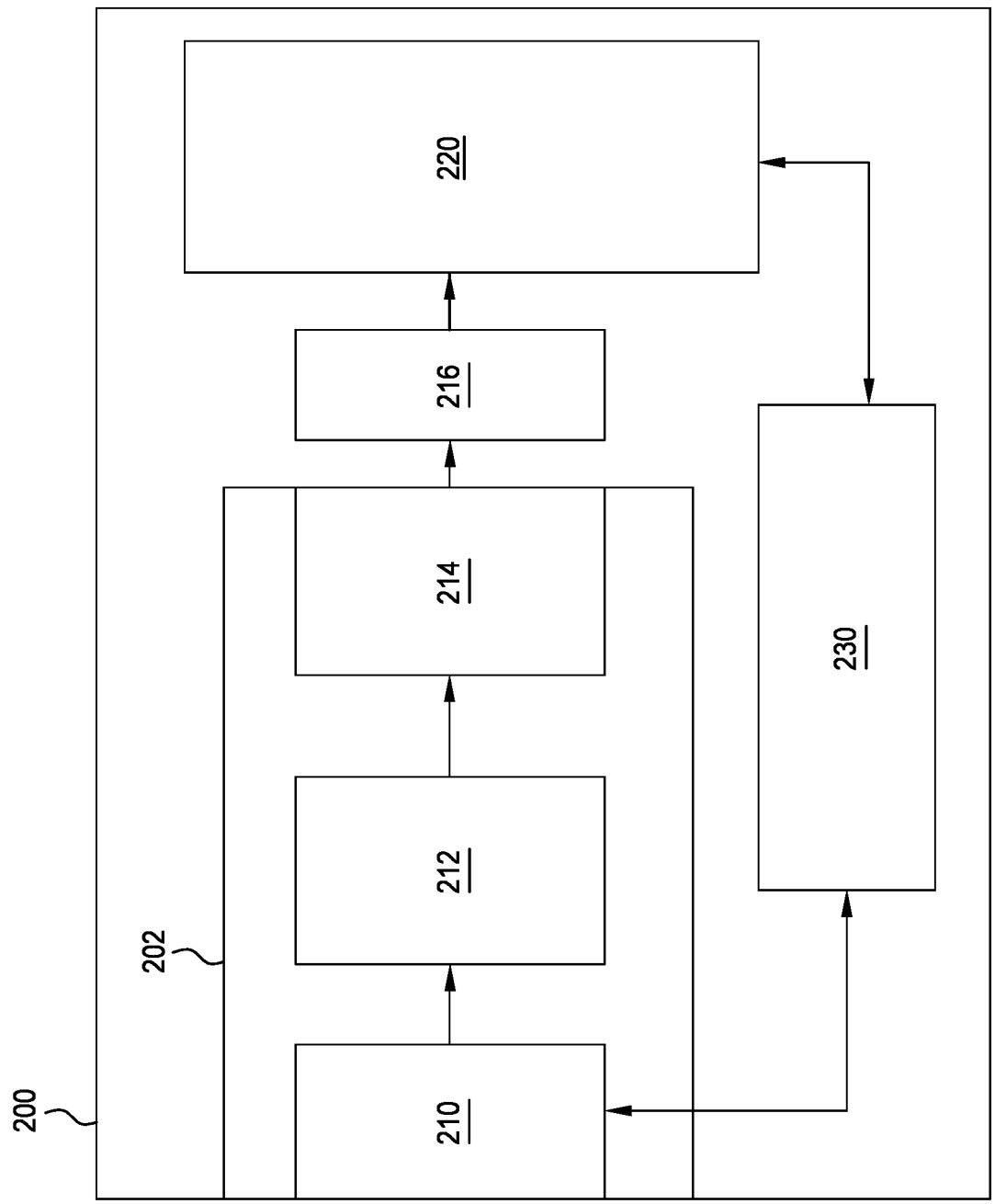
FIG. 2 illustrates a block diagram depicting an example semiconductor device according to some examples.

FIG. 2 is a schematic block diagram of a portion of a semiconductor device 200. The semiconductor device 200 may be any one of the semiconductor devices 102-118. As illustrated, the semiconductor device 200 includes a testing interface 202, memory elements 220, and test control circuitry 230. The testing interface 202 may be an iJTAG interface. The testing interface includes a test access port (TAP) controller 210, a scan-path network 212, and instruments 214. The testing interface 202 is connected to the memory elements 220 (e.g., design under test (DUT)) via the pins 216. Further, the testing interface 202 is connected with test control circuitry 230. The test control circuitry 230 is further connected to the memory elements 220. As will be described in greater detail in the following, the test control circuitry 230 generates control signals (e.g., clock signals and/or other control signals) and communicates the controls signals to the tap controller 210 and the memory elements 220.

Figure 3:
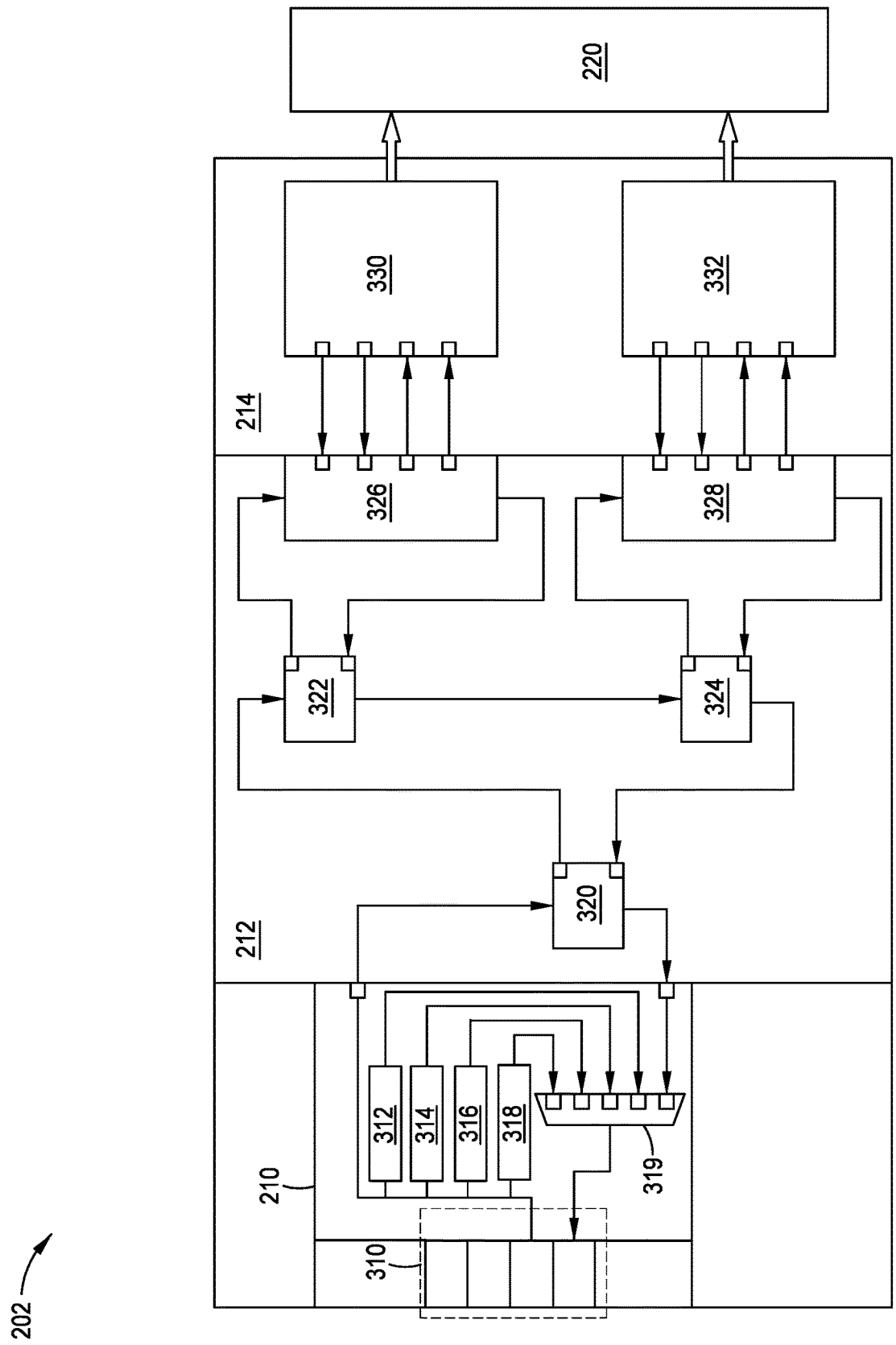
FIG. 3 illustrates a block diagram depicting an example testing interface device according to some examples.

As illustrated in FIG. 3, the tap controller 210 includes communication pins 310. The communication pins 310 receive test signals (e.g., test data) and control signals and output resultant test signals. For example, the communication pins 310 receive test data from the communication pin 120, output testing resulting signals from the communication pin 121, and receive control signals from the communication pin 122. The communication pins 310 include a test mode select (TMS) pin that receives TMS signals from the communication pin 122. The TMS signal is a voltage that controls the functionality of the testing interface 202. By altering the voltage of the TMS signal, the functionality of the testing interface 202 is altered. Altering the functionality of the testing interface 202, alters the flow of the state machine controlling the functionality of the testing interface 202. The TMS signal is a series of 1s (first voltage level) and 0s (a second voltage level). The order of the 1s and 0s determines the state of the state machine.

The communication pins 310 further include a test clock (TCK) pin that receives a TCK signal from the communication pin 122. The TCK signal is the clock control signal of the tap controller 210. For example, the TCK signal controls the speed of the tap controller 210.

The communication pins 310 further include a TDI pin. The TDI pin receives test data from the communication pin 120. The test data is a series of 1s and 0s. The test data may selected based on the TMS signal and the TCK signal.

The communication pins 310 include a TDO pin. The TDO pin outputs resultant test data to the communication pin 121. The resultant test data is a series of 1s and 0s.

The communication pins 310 may additionally include a test reset (TRST) pin. The TRST pin receives a TRST signal that resets the testing interface to a known good state. The TRST pin is optional, and in some embodiments, may be omitted.

The TAP controller 210 further includes a boundary scan register (BSR) 312. The BSR 312 includes a number of boundary scan cells. The boundary scan cells are used to set and/or read values from one or more of the communication pins 310. The BSR 312 is a register that communicates the test data to and from the communication pins 310.

The TAP controller 210 further includes a BYPASS (BYP) register 314. The BYP register 314 passes information from the TDI pin to the TDO pin. Further, the BYP register 314 allows other devices within the semiconductor device 200 to be tested.

The TAP controller 210 further includes an IDCODES register 316. The IDCODES register 316 contains the identification (ID) code and revision number for the semiconductor device 200. The ID code and revision number links the semiconductor device 200 to a boundary scan description language (BSDL) file containing details of the boundary scan configuration for the semiconductor device 200.

The TAP controller 210 further includes an instruction register (IR) 318. The IR 318 contains an instruction for the TAP controller 210. For example, the instruction may be a BYPASS instruction which can be used to stop one or more devices from outputting test data and/or other data signals on the TDO pin. The BYPASS instruction may effectively skip on or more devices during a testing procedure.

The TAP controller 210 further includes a multiplexer (MUX) 319. The MUX 319 selects from the output of the registers 312-318 and the test data output from the DUT of the semiconductor device 200. The output of the MUX 319 is connected to the TDO register and the signal output by the MUX 319 is communicated to the TDO.

The scan-path network 212 includes SIBs 320-324 and test data registers (TDRs) 326 and 328. The SIBs 320-324 connect the output of the tap controller 210 with the TDRs 326 and 328 via one or more scan paths. Enabling different ones of the SIBs 320-324 actives different scan paths within the scan-path network 212. For example, enabling the SIBs 320 and 322 activate the scan path between the SIB 320, the SIB 322, and the TDR 326. Further, enabling the SIBs 320, 322, and 324 activate the scan path between the SIB 320, the SIB 322, the SIB 324, and the TDR 328. Further, activating a scan path within the scan-path network 212, activates the instrument(s) (e.g., instruments 330 or 332 of the instruments 214) on the activated scan path. Disabling different ones of the SIBs 320-324 deactivates different scan paths within the scan-path network 212. Deactivating a scan path within the scan-path network 212, deactivates the instrument(s) on the deactivated scan path. The instrument(s) (e.g., the instrument 330 or 332) on the deactivated scan path are inaccessible.

The instruments 214 include the instrument 330 and the instrument 332. The instruments 330 and 332 may be memory built-in self-test (MBIST) logic. For example, the instrument 330 and/or 332 are capable of executing one or more algorithms to verify the functionality of one or more memory elements (e.g., the memory elements 220) and/or detect faults within the one or more memory elements.

The instrument 330 is connected to the TDR 326 and the instrument 332 is connected to the TDR 328. Further, the instruments 330 and 332 are connected to different portions of the memory elements 220. For example, the instruments 330 and 332 are connected to different portions of the memory elements 220 via the pins 216 of FIG. 2.

Figure 4:
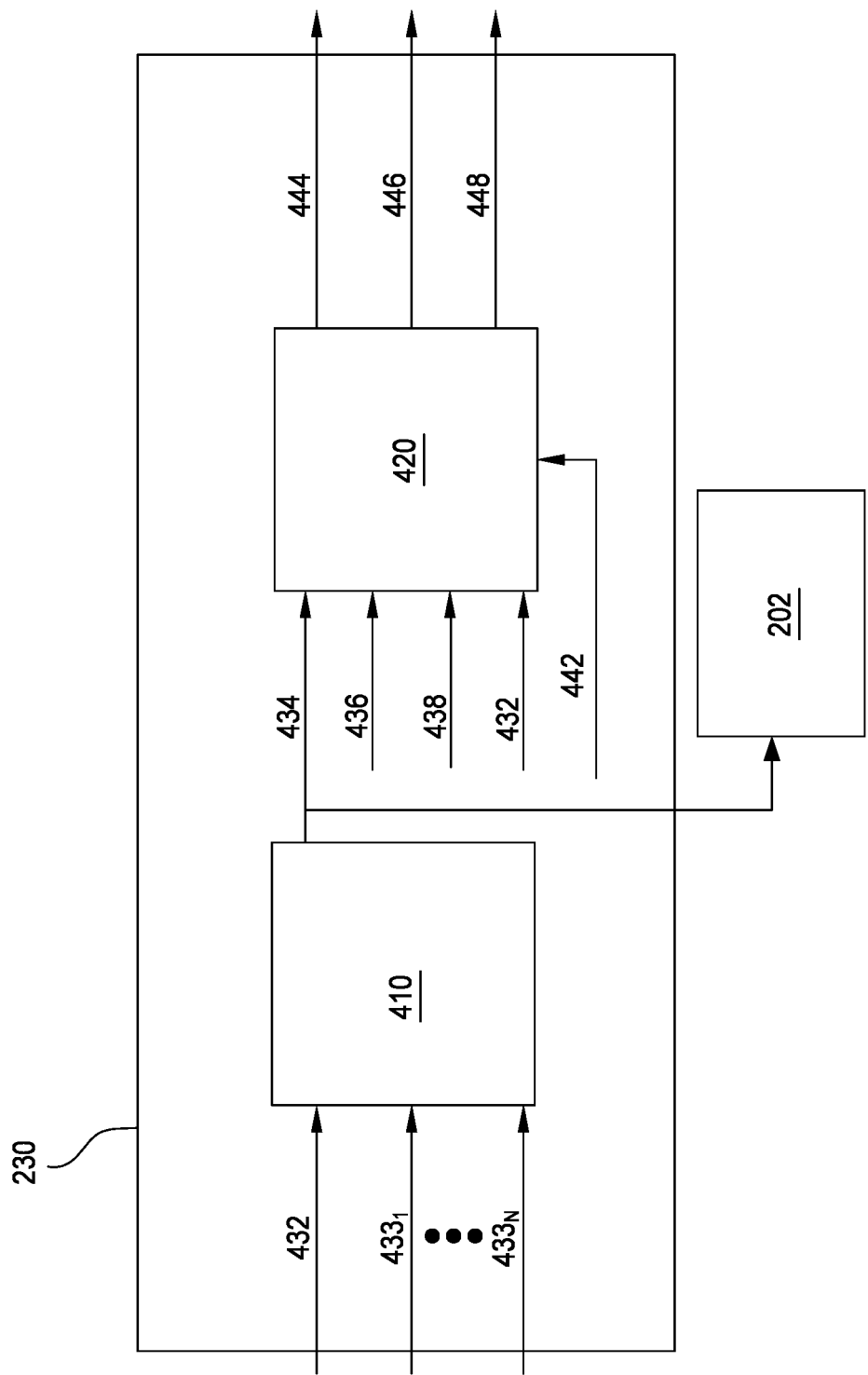
FIG. 4 illustrates a block diagram depicting an example test control circuitry according to some examples.

FIG. 4 is a schematic illustration of the test control circuitry 230. The test control circuitry 230 includes polling circuitry 410 and scan control sequencer circuitry 420. The polling circuitry 410 receives one or more clock signals 432, and clock identification signals 4331 through 433N. N is an integer of two or more. The polling circuitry 410 generates a clock stop signal 434. The clock stop signal 434 is provided to the testing interface 202 and the scan control sequencer circuitry 420. The polling circuitry 410 provides the clock stop signal 434 in response to a rising edge of the clock signal 432 and the clock identification signals 4331 through 433N indicating that corresponding clock signals have been stopped. Each of the clock identification signals 4331 through 433N corresponds to a different clock signal (i.e., a clock domain). For example, the clock signals are associated with the memory elements 220 and other circuit elements within the semiconductor device 200. In one example, a clock identification signal has a high value in response to the corresponding clock signal being stopped. In another example, a clock identification signal has a low value in response to the corresponding clock signal being stopped.

The scan control sequencer circuitry 420 receives the clock stop signal 434 from the polling circuitry 410. Further, the scan control sequencer circuitry 420 receives a test mode signal 436, a scan enable signal 438, the clock signal 432, and an initialization signal 442. The test mode signal 436, and the scan enable signal 438 are received from the tap controller 210. The clock signal 432 is provided by the semiconductor device 200.

The scan control sequencer circuitry 420 outputs one or more signals (e.g., the test mode signal 444, the scan enable output signal 446, and/or the scan clock signal 448) from one or more of the received signals. As will be described in greater detail in the following, the signals output by the scan control sequencer circuitry 420 are utilized to ensure glitch free switching of the clock signals of the memory elements 220 such that the memory elements 220 are placed in a known state by test data.

Figure 5:
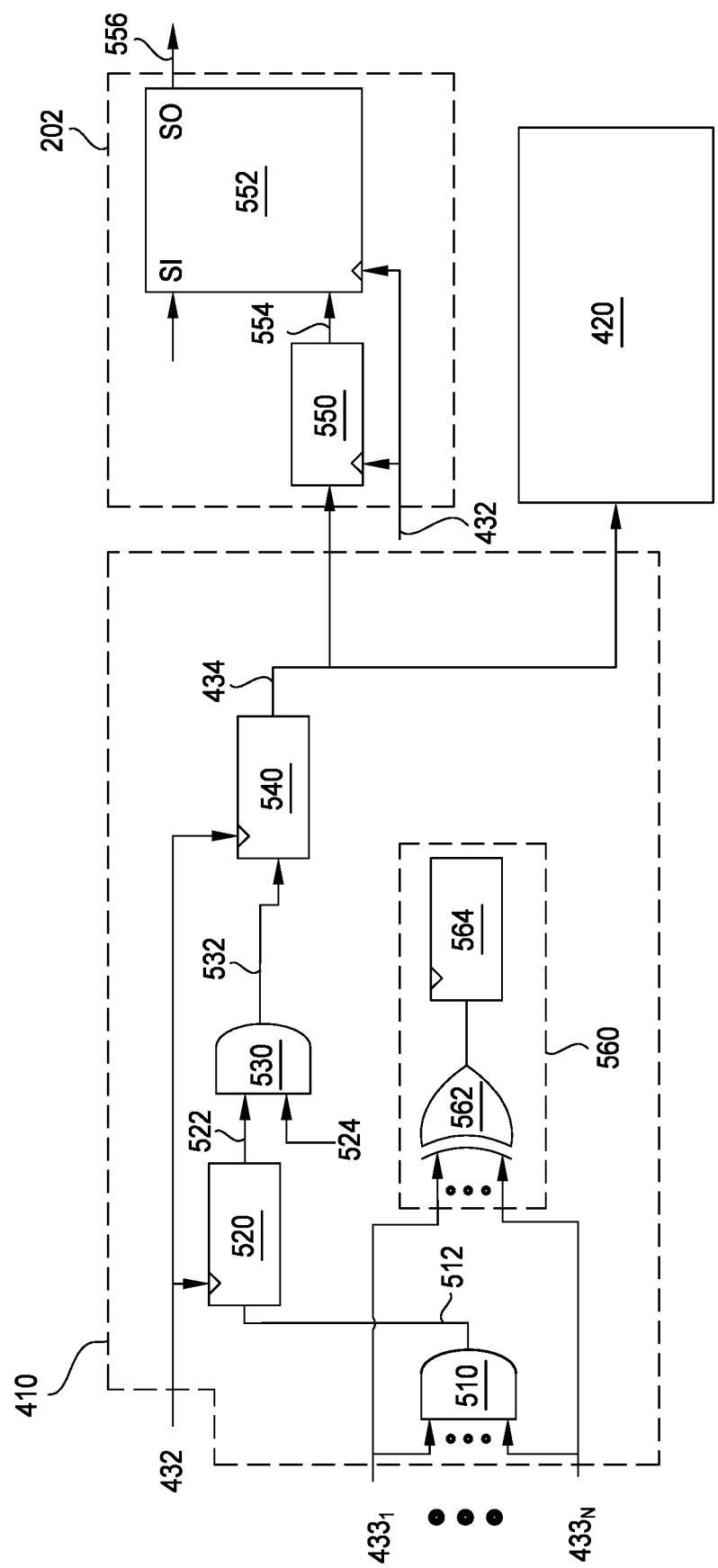
FIG. 5 illustrates a schematic block diagram depicting an example polling circuitry according to some examples.

FIG. 5 is a schematic illustration of the polling circuitry 410. The polling circuitry 410 receives the clock identification signals 4331 and 433N. Each of the clock identification signals 4331 and 433N corresponds to a corresponding clock signal domain. The polling circuitry 410 determines when each of one or more clock signals is stopped based on the clock identification signals 4331 and 433N. The clock signals may be stopped by corresponding clock stoppage circuitry. Each of the clock signals may be stopped by a common clock stoppage circuitry or two or more different clock signals may be stopped by different clock stoppage circuitries. The clock identification signals 4331 and 433N are output from the clock stoppage circuitry or circuitries. In one example, a clock stoppage circuit is configured to synchronize a stop control signal with a corresponding clock signal domain, latch the clock signal with an open low latch for timing purposes, and utilize the latch output as selection control signal of a clock multiplexer. An output selected by the clock multiplexer is a static 0.

The polling circuitry 410 includes an AND gate 510, a delay circuitry 520, an AND gate 530, and a storage element 540. An output of the AND gate 510 is connected to an input of the delay circuitry 520. The output of the delay circuitry 520 is connected to an input of the AND gate 530. The output of the AND gate 530 is connected to the storage element 540. The output of the storage element 540 is connected to the input of the testing interface 202 and the input of the scan control sequencer circuitry 420.

The AND gate 510 receives the clock identification signals 4331 and 433N from each corresponding clock domain. N is an integer greater than or equal to 2. The AND gate 510 receives each of the clock identification signals 4331 and 433N and generates an output signal 512 based on the state each of the clock identification signals 4331 and 433N. For example, if each of the clock identification signals 4331 and 433N indicates that a corresponding clock domain is stopped, the AND gate 510 outputs the output signal 512 indicating that each corresponding clock signal has been stopped. In such an example, the output signal 512 has a high value or a value of 1. When one or more of the clock identification signals 4331 and 433N indicates that a corresponding clock domain has not been stopped, the output signal 512 of the AND gate 510 is indicative that one or more of the clock domain signals has not stopped. For example, the output signal 512 has a low value, or a value of 0.

The AND gate 510 outputs the output signal 512 to the input of the delay circuitry 520. Further, the delay circuitry 520 further receives the clock signal 432. The delay circuitry 520 delays the output signal 512 to generate a delayed output signal 522. The delay circuitry 520 delays the output signal by several clocks generate the delayed output signal 522. For example, the delay circuitry 520 delays the output signal by about 15 ns. In other examples, the delay circuitry 520 delays the output signal by more than about 15 ns, or less than about 15 ns. Delaying the output signal aids in preventing observance of additional voltage variance due to sudden clock stoppage by dump circuitry or other circuit elements.

The delayed output signal 522 is received by a first input of the AND gate 530. A second input of the AND gate 530 receives the enable signal 524. The AND gate 530 generates an output signal 532 based on the delayed output signal 522 and the enable signal 524. The output signal 532 is indicative of the state of the delayed output signal 522 and the enable signal 524. For example, the output signal 532 is indicative of when the delayed output signal 522 and the enable signal 524 are both high.

The output signal 532 is received by the storage element 540. Further, the storage element 540 further receives the clock signal 432. The storage element 540 stores the state of the output signal 532. In one embodiment, the storage element 540 stores the state of the output signal 532 even if the state of the output signal 532 fluctuates. The storage element 540 generates the clock stop signal 434.

The clock stop signal 434 is provided to an input of the testing interface 202 and an input to the scan control sequencer circuitry 420. The clock stop signal 434 provides an indication that each off the corresponding clock domains (e.g., the clock signal associated with each clock identification signal 433) has been stopped.

A portion of the testing interface 202 is illustrated in FIG. 5. As illustrated, the testing interface 202 includes synchronization circuitry 550 and an SIB 552. The synchronization circuitry 550 receives the clock stop signal 434 and the clock signal 432 to synchronize the clock of the testing interface 202 with the output of the polling circuitry 410 (e.g., the clock stop signal 434). The synchronization circuitry 550 includes delay logic and generates a synchronized output signal 554 that is provided to the SIB 552. The SIB 552 also receives the clock signal 432 and generates an output signal 556 from the pin SO indicative of whether or not the clock domains corresponding to the clock identification signals 433 have been stopped or not. For example, the value of the SIB 552 is set to a value of "1" in response to the clock domains being stopped, and the output signal 556 of the SIB 552 provided by the pin SO is indicative of the SIB being set to "1".

The polling circuitry 410 may additionally include defect testing circuitry 560. The defect testing circuitry 560 includes an XOR gate 562 and a memory element 564. The XOR gate 562 receives each of the clock identification signals 433 and determines whether or not any of the clock signals corresponding to the clock identification signals 433 has not been stopped. The output of the XOR gate 562 is stored within the memory element 564 and may be observed to determine whether or not one or more of the clock signals has not been stopped. The output of the XOR gate 562 is compared to the output signal 512 and/or the clock stop signal 434 to determine if the elements of the polling circuitry 410 are properly functioning. In one example, as the clock signals are stopped, each additional clock signal toggles the XOR gate 562. In such an example, no defects are determined when the expected value of the final output of the XOR gate 562 matches a value of a parity circuit.

Figure 6:
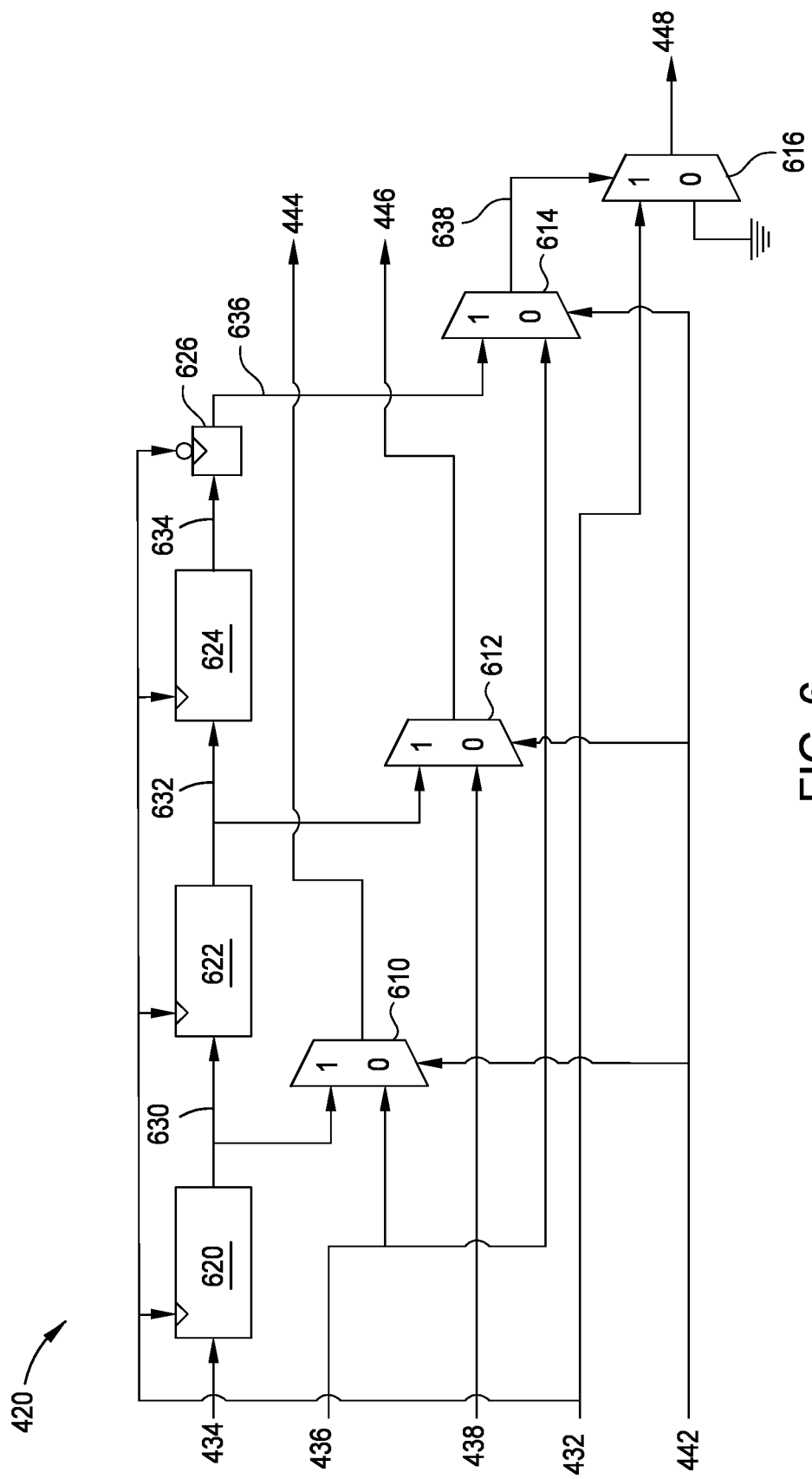
FIG. 6 illustrates a schematic block diagram depicting an example scan control sequencer circuitry according to some examples.

FIG. 6 is a schematic block diagram of the scan control sequencer circuitry 420, according to one or more examples. As is described above with regard to FIG. 4, the scan control sequencer circuitry 420 receives the clock stop signal 434 from the polling circuitry 410. Further, the scan control sequencer circuitry 420 receives the test mode signal 436, the scan enable signal 438, the clock signal 432, and the initialization signal 442 from the test device 130 and/or another element within the semiconductor device 200. The scan control sequencer circuitry 420 outputs the test mode signal 444, the scan enable output signal 446, and/or the scan clock signal 448.

The scan control sequencer circuitry 420 includes one or more MUXs 610-616, one or more delay circuitries 620-624, and a falling edge detector circuitry 626. The delay circuitries 620-624 each gate (e.g., delay) the clock stop signal 434 to generate delayed signals (e.g., delayed signals 630-634). Further, the delay circuitries 620-624 receive the clock signal 432. The delay circuitry 620 receives the clock stop signal 434 and the clock signal 432. The delay circuitry 620 gates the clock stop signal 434 to generate the delayed signal 630. For example, the delay circuitry 620 delays the clock stop signal 434 by about 30 ns. In other embodiments, the delay circuitry 620 delays the clock stop signal 434 by less than or more than about 30 ns. The output of the delay circuitry 620 is connected to an input of the MUX 610. The input of the MUX 610 receives the delayed signal 630 from the output of the delay circuitry 620. Further, the input of the MUX 610 receives the test mode signal 436. The test mode signal 436 is received from the tap controller 210. The MUX 610 receives the initialization signal 442 as a control signal. The output of the MUX 610 is the test mode signal 444. The output of the MUX 610 corresponds to the delayed signal 630 based on the initialization signal 442 going to a high level and the test mode signal 436 in response to the initialization signal 442 going to a low level. The test mode signal 444 is a delayed (e.g., gated) version of the clock stop signal 434. Further, the test mode signal 444 goes high after the delay circuitry 620 delays the clock stop signal 434.

The output of the delay circuitry 620 is further connected to an input of the delay circuitry 622. The delay circuitry 622 receives the delayed signal 630 from the delay circuitry 622. The delay circuitry 622 also receives the clock signal 432. The delay circuitry 622 generates a delayed signal 632 based on the delayed signal 630 and the clock signal 432. The delay circuitry 622 gates (e.g., delays) the delayed signal 630 to generate a delayed signal 632. For example, the delay circuitry 622 gates (e.g., delays) the delayed signal 630 by about 30 ns. In other embodiments, the delay circuitry 622 gates (e.g., delays) the delayed signal 630 by less than or more than about 30 ns. An output of the delay circuitry 622 is output to an input of the MUX 612. The second input of the MUX 612 receives the scan enable signal 438. The MUX 612 receives the initialization signal 442 as a control signal. The MUX 612 outputs the scan enable output signal 446.

The output of the MUX 612 corresponds to the delayed signal 632 based on the initialization signal 442 going high. The scan enable output signal 446 is a gated (e.g., delayed) version of the clock stop signal 434 and includes more delay than the test mode signal 444. The scan enabled output signal 446 goes high after a delay provided by the delay circuitry 622. The output of the MUX 612 corresponds to the scan enable signal 438 based on the initialization signal 442 going low.

The output of the delay circuitry 622 is further connected to an input of the delay circuitry 624. The delay circuitry 624 receives the delayed signal 632 and generates a delayed signal 634. The delay circuitry 624 delays the delayed signal 632 to generate the delayed signal 634. For example, the delay circuitry 624 gates (e.g., delays) the delayed signal 632 by about 30 ns. In other examples, the delay circuitry 624 gates (e.g., delays) the delayed signal 632 by less than or more than about 30 ns.

The output of the delay circuitry 624 is connected to an input of the falling edge detector circuitry 626. The falling edge detector circuitry 626 generates an output signal 636 in response to a falling edge of the clock signal 432. An output, e.g., the output signal 636, of the falling edge detector circuitry 626 is received by a first input of the MUX 614. A second input of the MUX 614 receives the test mode signal 436. The initialization signal 442 is provided to the MUX 614 as the control signal and the MUX 614 generates an output signal, e.g., scan select signal 638, based on the output signal 636, test mode signal 436, and the initialization signal.

The MUX 614 outputs the output signal 636 as the scan select signal 638 based on the initialization signal 442 going high. The MUX 614 outputs the test mode signal 436 as the scan select signal 638 based on the initialization signal 442 going low. The scan select signal 638 is a gated (e.g., delayed) version of the delayed signal 632 and includes more delay than the scan enable output signal 446. The scan select signal 638 goes high after a delay provided by the delay circuitry 624 and in response to a falling edge of the clock signal 432.

The output (e.g., the scan select signal 638) of the MUX 614 is received by the MUX 616 and functions as the control signal of the MUX 616. A first input of the MUX 616 receives the clock signal 432 and a second input of the MUX 616 is coupled to a direct current (DC) voltage (e.g., a ground voltage or reference voltage).

The MUX 616 outputs the scan clock signal 448 based on the scan select signal 638 going high. The scan clock signal 448 is the clock signal 432 when the scan select signal 638 is high and the DC voltage when the scan select signal 638 is low. Stated another way, the scan clock signal 448 is a gated version of the clock signal 432.

The delay circuitries 620, 622, and 624, and the MUXs 610, 612, 614, and 616 gate the clock signal 432 to generate the scan clock signal 448. For example, the delay circuitries 620, 622, and 624, and the MUXs 610, 612, 614, and 616 gate the clock signal 432 based on the clock stop signal 434, the test mode signal 436, the scan enable signal 438, and/or the initialization signal 442. In the example illustrated in FIG. 6, the delays of the delay circuitries 620, 622, and 624 provide the staging delays for asserting and settling the scan control signals (e.g., the scan clock signal 448 and/or the scan select signal 638) in order. The delay circuitries 620, 622, and 624 provide the staging delays for asserting scan enable output signal 446 before asserting the scan select signal 638. In one example, once the test mode signal 436 and the scan enable signal 438 settle, the clock signal 432 is utilized to capture values from one or more of the memory elements 220. Further, glitch free switching may be assured through the use of a synchronized clock MUX select signal (e.g., the scan select signal 638) driven by the falling edge flop of the clock signal 432. Utilizing the falling edge detector circuitry 626 ensures that the scan clock signal 448 is not output while the clock signal 432 is high and that the scan clock signal 448 is output while the clock signal 432 is low.

Figure 7:
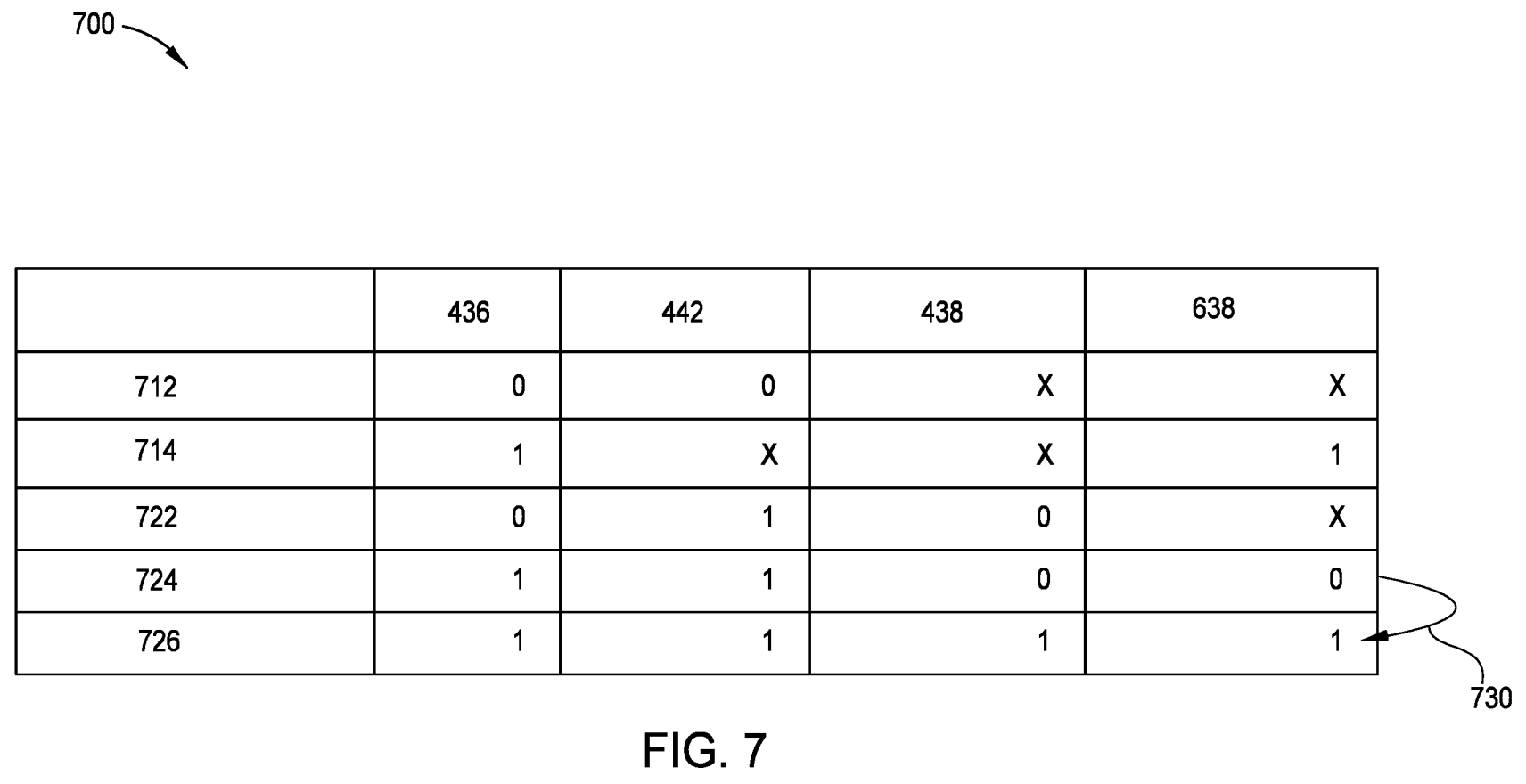

FIG. 7 illustrates a table 700. The table 700 illustrates the different states of the test mode signal 436, the initialization signal 442, the scan enable signal 438, and the scan select signal 638 relative to the mission mode 710, scan test mode (boundary test mode) 712, and clock stop scan and clock modes (e.g., modes 722, 724, and 726). The mission mode 710 corresponds to normal operation of a semiconductor device (e.g., the semiconductor device 200). The scan test mode 712 corresponds testing of the memory elements of the semiconductor device. For example, when the value of the scan test mode 712 is "1", the semiconductor device is configured for testing of the memory elements as is described above. The clock stop scan and clock modes 722-726 correspond to different modes for stopping the clock signals of a DUT (e.g., the memory elements 220). For example, the mode 722 corresponds to the mission mode of the DUT. The mode 724 corresponds to when the clock signals of the DUT are determined to have been stopped (e.g., as is described with regard to FIG. 5). The mode 726 corresponds to when test data is shifted into the DUT. As the scan select signal 638 is synchronized to the clock signal 432 (e.g., as is described above with regard to FIG. 6), switching of value of the scan select signal 638 from "0" to "1", as indicated by arrow 730, is glitch free.

Figure 8:
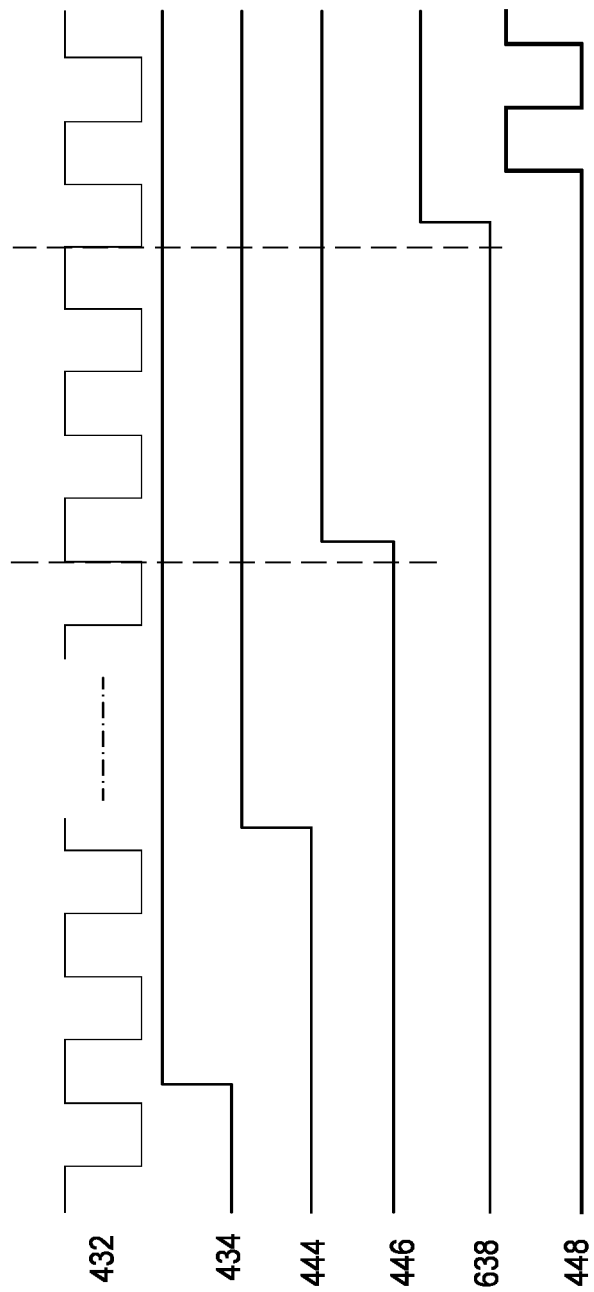
FIG. 8 illustrates example signal waveforms of signals input and output by a scan control sequencer circuitry.

FIG. 8 is a waveform diagram of the clock signal 432, the clock stop signal 434, the test mode signal 444, the scan enable output signal 446, the scan select signal 638, and the scan clock signal 448. As illustrated, the test mode signal 444 is delayed with respect to the clock stop signal 434, the scan enable output signal 446 is delayed with respect to the test mode signal 444, and the scan select signal 638 is delayed with respect to the scan enable output signal 446. Further, the clock stop signal 434, the test mode signal 444, the scan enable output signal 446, the scan select signal 638 correspond to a rising edge of the clock signal 432. The scan clock signal 448 is delayed with reference to the scan select signal 638. The scan clock signal 448 corresponds to a falling edge of the clock signal 432.

Figure 9:
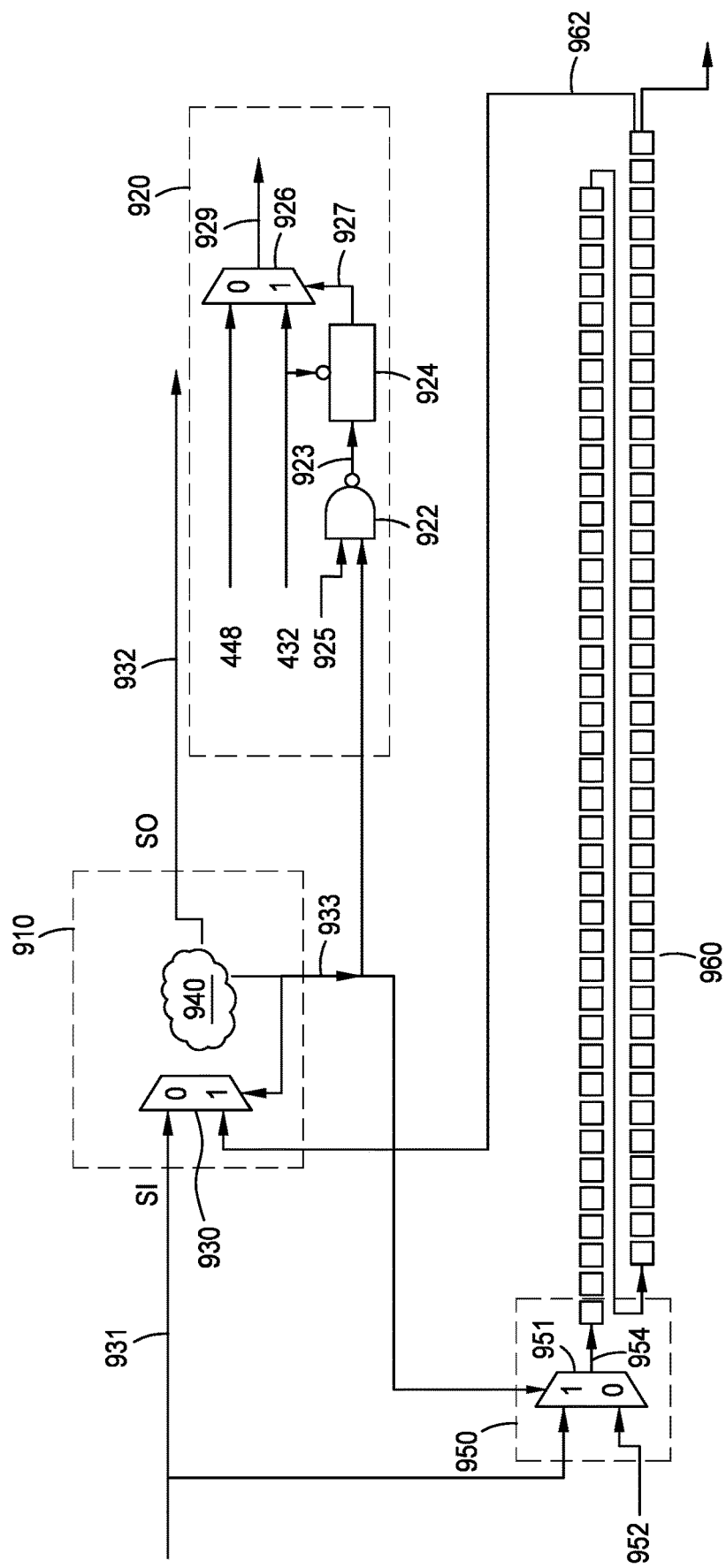
FIG. 9 is a schematic block diagram of an example segment insertion bit according to some examples.

FIG. 9 illustrates an SIB 910 (e.g., the SIB 320, 322, or 324) of a scan-path network (e.g., the scan-path network 212), clock control circuitry 920, and scan circuitry 950, according to one or more embodiments. The SIB 910 controls the communication of test data to and from the memory elements under test (e.g., the memory elements 220). For example, the SIB 910 controls the clock control circuitry 920 and the scan circuitry 950 to initialize memory elements to a known state and/or configuration to ensure that the memory elements are functioning as expected. The SIB 910 controls the communication of test data (e.g., a bitstream) to and from the memory elements. The test data is communicated by the SIB 910 via one or more control signals. As will be described in greater detail in the following, the test data received from the memory elements is processed by the test device 130 to determine the functionality of the memory elements. In one example, the test data is communicated to and from the memory elements as part of a debugging process. When performing a debugging process, the memory elements (e.g., the memory elements 220) are loaded with an expected value based on the test data and then observed to determine the functionality of the memory elements. Stated another way, a snapshot of the memory elements 220 is taken and then observed to determine whether not any of the tested memory elements are exhibiting any bugs (e.g., not functioning as expected).

The scan clock signal 448 is provided to the memory elements 220 under test. As is described above, the scan clock signal 448 is available during test and is provided by the test control circuitry 230. In one example, the scan clock signal 448 is only available (e.g., generated) during preparation for testing and/or during test of a DUT (e.g., the memory elements 220). In another example, the scan clock signal 448 is available during periods outside of preparation for testing and/or during test of a DUT. The scan clock signal 448 is the clock signal that is applied to the design elements under test. For example, the memory elements 220 are driven with test data based on the pulses of the scan clock signal 448. Further, the test data is output from the memory elements 220 based on the pulses of the scan clock signal 448. As is discussed with reference to FIGS. 4 and 5, the scan clock signal 448 is generated based on the clock signals of at least the memory elements 220 being stopped. For example, the scan clock signal 448 is generated based on the clock stop done signal 434. Stopping the clocks of the memory elements, freezes the state of the memory elements 220 such that the memory elements 220 may be loaded with test data. Freezing the state of the memory elements 220 stops the memory elements 220 from changing between states. Outputting the data from the memory elements 220 may be based on the clock signal 432.

The SIB 910 receives upstream signal 931 from another SIB within a common scan path (e.g., SIB 320, 322, 324 of scan-path network 212) or from a tap controller (e.g., the tap controller 210). Further, the SIB 910 communicates a control signal (e.g., downstream signal) 932 to another SIB within the common scan path or to the tap controller 210.

The SIB 910 outputs a control signal 932 to the clock control circuitry 920 and the scan circuitry 950. The control signal (e.g., downstream signal) 932 is generated by the control circuitry 940 of the SIB 910.

An input of the clock control circuitry 920 is connected to an output of the SIB 910. The clock control circuitry 920 includes a NAND gate 922, latch circuitry 924, and a MUX 926. An input of the NAND gate 922 receives the control signal 932 and shift signal 925 originating from the TAP controller finite state machine (FSM) on the die of the corresponding semiconductor device. The output signal 923 of the NAND gate 922 is output to the latch circuitry 924. The clock signal 432 is provided to latch circuitry 924 and the MUX 926. The latch circuitry 924 detects a falling edge of the clock signal 432 and outputs a control signal 927 based on the detected falling edge. The control signal 927 is provided to the MUX 926 as a MUX control signal. The control signal 927 is a low value when the clock signal 432 is low and a high value when the clock signal 432 is high.

A first input of the MUX 926 receives scan clock signal 428, and a second input of the MUX 926 receives the clock signal 432 and outputs the local clock signal 929 based on the control signal 927. The MUX 926 outputs the clock signal 432 as the local clock signal 929 based on the control signal 927 having a low value and outputs the scan clock signal 428 as the local clock signal 929 based on the control signal 927 having a high value. The scan clock signal 448 may be driven onto the memory elements as the local clock signal 929. The local clock signal 929 is provided to the memory elements of the scan chain 960 to synchronize the clock of the memory elements to a common scan chain 960.

The scan circuitry 950 controls the setting and observation of the memory elements (e.g., the memory elements 220) that are under test. The scan circuitry 950 includes MUX 951. The MUX 951 receives an upstream signal 931 at a first input, a scan chain control signal 952 at a second input, and a control signal 933. The upstream signal 931 may include data provided by other semiconductor devices (e.g., one or more of the semiconductor devices (102-118) or other circuit blocks coupled to the testing interface 202. In one example, an upstream signal 931 received by the semiconductor device 108 includes test data corresponding to one or more of the semiconductor devices 102-108. Additionally, or alternatively, the upstream signal 931 includes test data from one or more TDRs within the testing interface 202, and/or one or more SIBs within the testing interface 202. The control signal 933 is generated by the control circuitry 940 and output by the SIB 910. The MUX 951 outputs a scan chain signal 954 based on the control signal 933. For example, based on the control signal 933 having a high level, the MUX 951 outputs the upstream signal 931 as the scan chain signal 954, and, based on the control signal 933 having a low level, the MUX 951 outputs the scan chain control signal 952 as the scan chain signal 954. The scan chain signal 954 is the test data provided to the memory elements under test. The memory elements under test may be referred to as a scan chain 960. The scan chain 960 includes two or more memory elements. In FIG. 9, the memory elements of the scan chain 960 are illustrated as blocks.

Scan chain 960 receives the output of the MUX 951. For example, the scan chain 960 receives the scan chain signal 954 and shifts the scan chain signal 954 through the each memory elements within the scan chain 960 such that each memory elements of the scan chain 960 receives a corresponding bit of the scan chain signal 954. The scan chain signal 954 may be a series of bits that determine the state of corresponding memory elements. After the scan chain signal 954 is loaded, and after one or more clock pulses (e.g., pulses of the local clock signal 929), the data within the memory elements within the scan chain 960 is shifted out as the data signal 962. The data shifted out of the scan chain 960, e.g., the data signal 962, is communicated to the test device 130 to determine if one or more of the memory elements has a fault (e.g., a bug).

The SIB 910 further includes a MUX 930. The SIB 910 splices the data signal 962 into the signal (e.g., bitstream) that is output via the signal out (SO) terminal as the downstream signal 932 via the MUX 930. The MUX 930 receives, at a first input, an upstream signal (e.g., a control signal) 931. Further, the MUX 930 receives, at a second input, the data signal 962. The MUX 930 receives the control signal 932 that controls the output of the MUX 930. The MUX 930 outputs the upstream signal 931 based on the control signal 932 having a high level, and the MUX 930 outputs the data signal 962 based on the control signal 932 having a low level. The output of the MUX 930 is output via the SO pin of the SIB 910 as the control signal 932.

Figure 10:
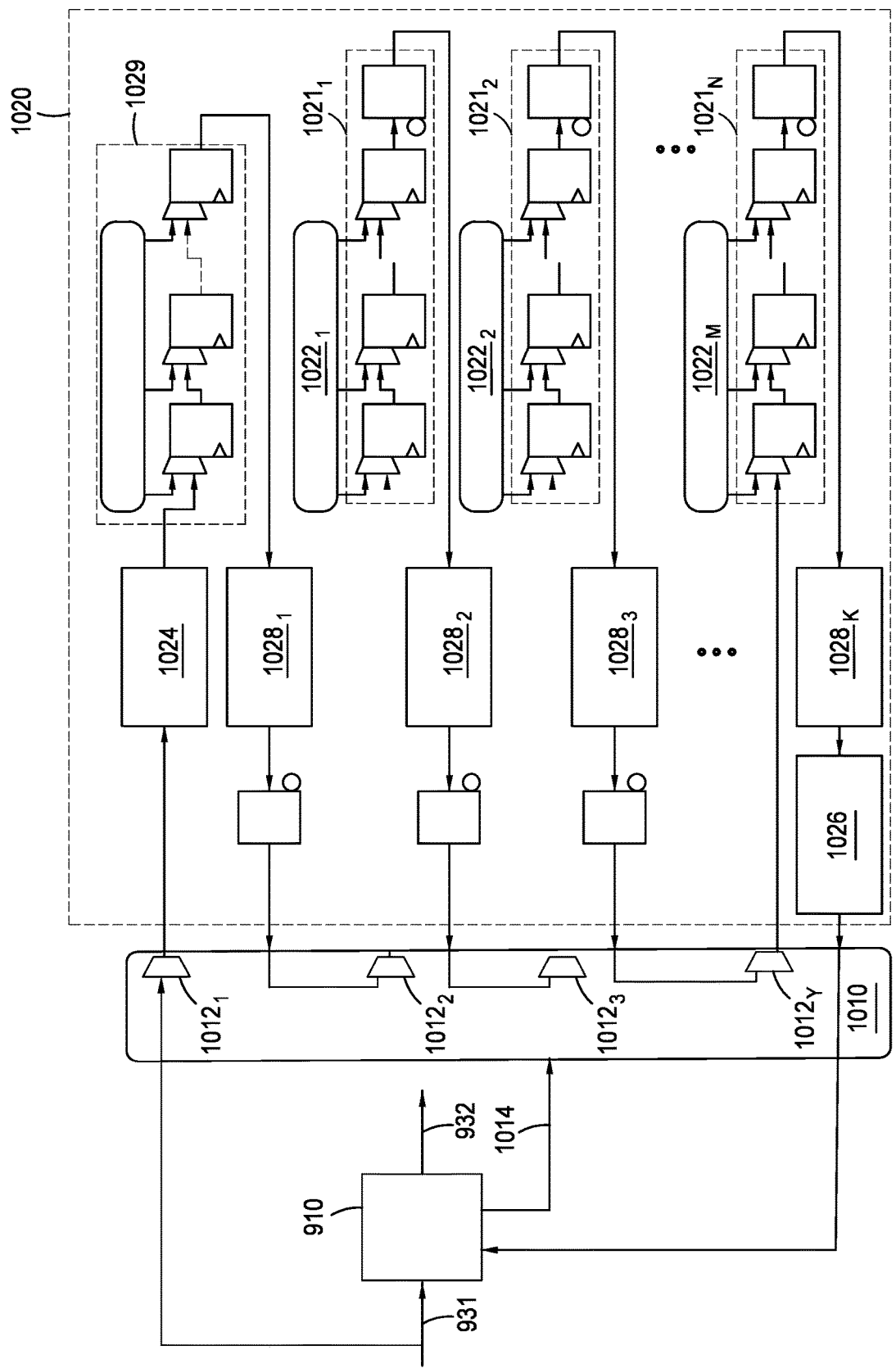
FIG. 10 is a block diagram depicting an example segment insertion bit and a design under test according to some examples.

FIG. 10 illustrates an SIB 910, scan chain logic 1010, and devices under test 1020. The SIB 910 communicates with the scan chain logic 1010 to control the device under test 1020.

The device under test 1020 includes host intellectual property (IP) logic $1022_1$, $1022_2$, and $1022_M$ (M is an integer greater than 2), memory element segments $1021_1$, $1021_2$, and $1021_N$ (N is an integer greater than 2) end marker register 1024, start marker register 1026, and short-chain marker registers $1028_1$, $1028_2$, $1028_3$, and $1028_Z$ (Z is an integer greater than 3), and fault detection circuitry 1029.

The memory element segments $1021_1$, $1021_2$, and $1021_N$ are different segments of the memory elements 220 of FIG. 2. Each of the memory element segments $1021_1$, $1021_2$, and $1021_N$ form a respective scan chain (e.g., scan chain 960). Based on a control signal 1014 provided by the SIB 910 and the scan chain logic 1010, the memory element segments $1021_1$, $1021_2$, and $1021_N$ are serially connected to each other (e.g., daisy-chained) to form a combined scan chain. Further, each of memory element segments $1021_1$, $1021_2$, and $1021_N$ corresponds to a respective host-IP logic $1022_1$, $1022_2$, and $1022_M$. The host-IP logic $1022_1$, $1022_2$, and $1022_M$ may also be referred to as semiconductor IP core, an IP core, or an IP block. The host-IP logic is a reusable unit of logic, cell, or IC layout design.

The end marker register 1024 is a TDR. The end marker register 1024 is loaded with a uniquely identifiable bit-string(s). The bit-string is an end marker element that is used as a marker to identify an end of a corresponding scan chain. For example, the bit-string of the end marker register 1024 is an end marker used to identify the end (last memory element) of the scan chain (e.g., the scan chain 960 of FIG. 9) comprising the memory element segments $1021_1$, $1021_2$, and $1021_N$. The marker stored within the end marker register 1024 is added to the end of the test data (e.g., bitstream) loaded into the memory element segments $1021_1$, $1021_2$, and $1021_N$. The end marker register 1024 is one or more bits in size. In one example, the end marker register 1024 is a 16 bit register.

The start marker register 1026 is a TDR. The start marker register 1026 is loaded with a uniquely identifiable bit-string(s). The bit-string is a start marker element that is used as a marker to identify an end of the corresponding scan chain. For example, the bit-string of the start marker register 1026 is a start marker used to identify the start (e.g., first memory element) of the scan chain (e.g., the scan chain 960 of FIG. 9) comprising the memory element segments $1021_1$, $1021_2$, and $1021_N$. The start marker register 1026 is one or more bits in size. In one example, the start marker register 1026 is a 16 bit register. The end marker register 1024 and the start marker register 10256 may the same size or differ in size. The marker stored within the start marker register 1026 is added to the beginning (or start) of the test data (e.g., bitstream) loaded into the memory element segments $1021_1$, $1021_2$, and $1021_N$.

The bit-string (e.g., end marker element) of the end marker register 1024 and the bit-string (e.g., start marker element) of the start marker register 1026 delimit the test data. The bit-string of the end marker register 1024 and the bit-string of the start marker register 1026 are spliced into the locations at the beginning and end of the test data of a single chain during a shift action. Alternatively, the contents of the end marker register 1024 and the start marker register 1026 is transferred to one or more memory elements that may be used to shift the data through the single chain. The MUX $1012_1$ receives the scan chain signal 954 as part of the upstream signal (control signal) 931.

The scan chain logic 1010 includes MUXs 1012. The output of each MUX 1012 is connected to different segment (e.g., the memory element segments $1021_1$, $1021_2$, or $1021_N$) of the memory elements 220. Further, an input of the MUX $1012_2$ is connected to the output of the memory elements of fault detection circuitry 1029, and an input of the MUX $1012_3$ is connected to an output of the memory element segment $1021_1$, and an input of the MUX $1012_Y$ (Y is an integer greater than three) is connected to an output of the memory element segment $1021_2$.

A control signal is provided by the SIB 910 to configure the MUXs 1012 such that the output of one memory element segment 1021 is connected to an input of a following the memory element segment 1021. For example, the MUX $1012_3$ connects the output of the memory element segment $1021_1$ to the input of the memory element segment $1021_2$. The MUX $1012_Y$ connects the output of the memory element segment $1021_2$ to the input of the memory element segment $1021_N$.

The output of each of the memory element segments $1021_1$, $1021_2$, and $1021_N$ is received by a short chain marker register 1028. For example, the memory element segment $1021_1$ is connected to the short chain marker register $1028_2$, the memory element segment $1021_2$ is connected to the short chain marker register $1028_3$, and the memory element segment $1021_N$ is connected to the short chain marker register $1028_K$ (K is an integer greater than 3). Each of the short chain marker registers 1028 inserts a respective identification bit (e.g., marker) into the test data output by a respective memory element segment 1021. For example, the short chain marker register $1028_2$ adds an identification bit to the output of the memory element segment $1021_1$, the short chain marker register $1028_3$ adds an identification bit to the output of the memory element segment $1021_2$, and the short chain marker register $1028_K$ adds an identification bit to the output of the memory element segment $1021_N$. In one example, when capturing data from multiple segments 1021, the corresponding identification bit tags the test data output from the respective memory element segment 1021. The identification bit may be used by the test device 130 to identify each segment 1021.

While the example of FIG. 10 includes a single SIB (e.g., SIB 910), in other examples, multiple SIBs may be utilized and each of the SIBs may be connected to a different one or more segments of the memory elements 220. In such examples, each SIB controls a different segment or segments of memory elements (e.g., the memory elements 220) to debug the memory elements.

Figure 11:
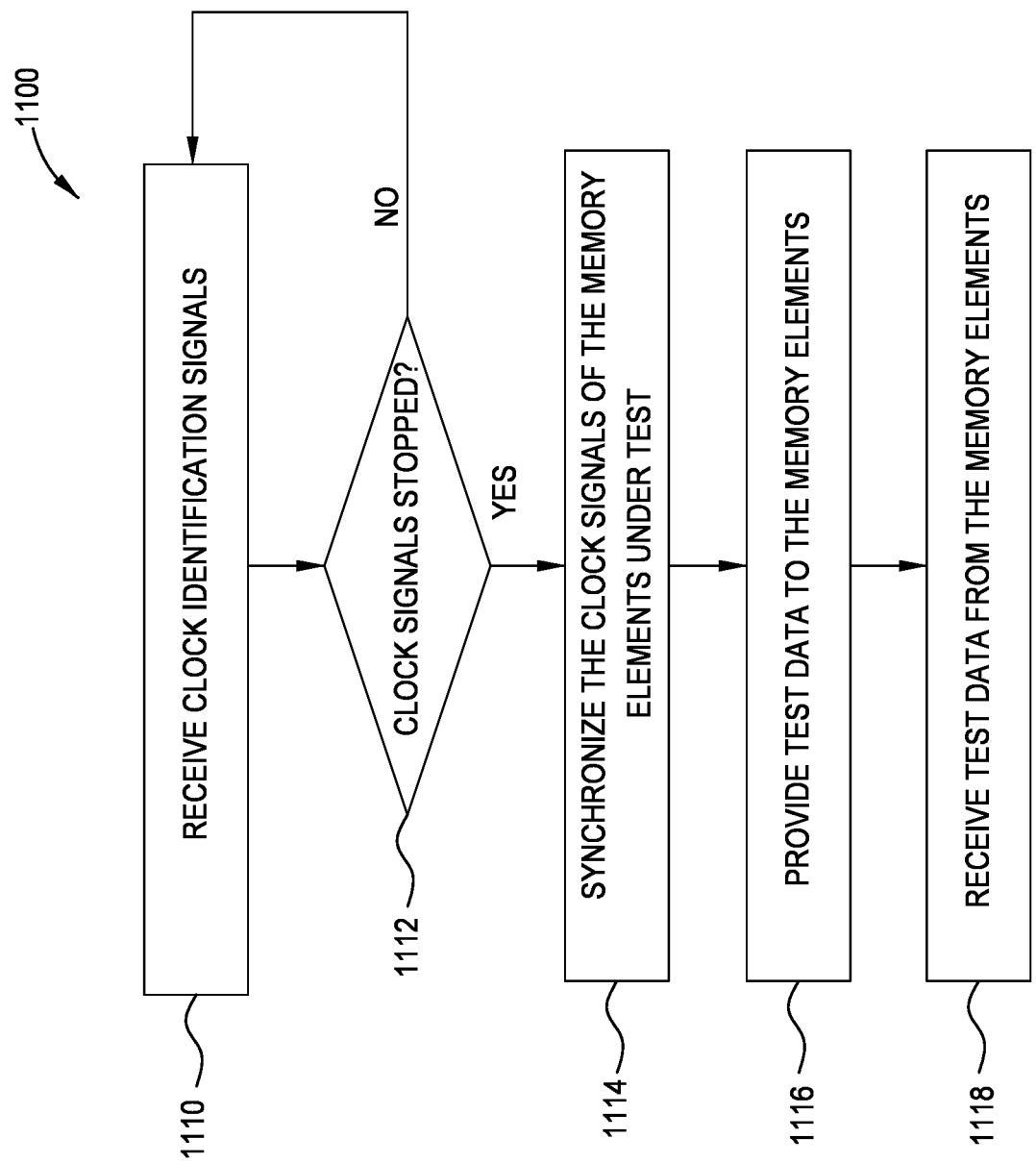
FIG. 11 is a flow chart illustrating a method to test memory elements according to some examples.

FIG. 11 is a flow chart of a method 1100 for debugging one or more memory elements, according to one or more examples. At operation 1110, clock identification signals are received by the test control circuitry 230. For example, clock identification signals are received by the polling circuitry 410 of the test control circuitry 230. Clock stoppage circuitry stops the clock signals of the memory elements 220 and/or other portions of the semiconductor device 200, and the clock identification signals 433 corresponds to the state of the clock signals. For example, the clock identification signals 433 provide an indication as to whether or not a corresponding clock signal has been stopped. At operation 1112, a determination as to whether or not the clock signals have been stopped is made. As is described above with regard to FIGS. 4 and 5, the polling circuitry 410 determines whether or not the clock signals have been stopped based on the clock identification signals 433 and a clock signal 432. For example, the polling circuitry 410 compares each of the clock identification signals 433 to each other. If one or more of the clock identification signals 433 indicate that a corresponding clock signal has not been stopped, the polling circuitry 410 generates an output signal (e.g., the output signal 512) indicating that not all of the clock signals have been stopped. Based on the determination that the clock signals have not been stopped, the operation 1110 is repeated.

If the clock identification signals 433 indicate that each of the corresponding clock signals has been stopped, the polling circuitry 410 generates an output signal (e.g., the output signal 512) indicating that all of the clock signals have been stopped. Based on the determination that the clock signals have been stopped, the clock signals of the memory elements under test are synchronized at operation 1114. For example, the polling circuitry 410 generates a clock stopped signal 434 based on a determination that each the clock signals have been stopped. The clock stopped signal 434 is output from the polling circuitry 410 to the scan control sequencer circuitry 420. The scan control sequencer circuitry 420 generates a scan clock signal 448 based on the clock stopped signal 434. The scan clock signal 448 is output to each of the memory elements (e.g., the memory elements 220) under test to synchronize the clock signals of each of the memory elements under test.

At operation 1116, test data is provided to the memory elements 220 under test. For example, an SIB (e.g., the SIB 910) connected to the memory elements under test (e.g., the segments 1021) provides test data (e.g., a bitstream) to the memory elements under test. The test data is provided to the memory elements under test once each of the clock signals are confirmed to be stopped.

At operation 1118, the test data is received (e.g., collected) from the memory elements under test by the test device 130. For example, the resulting test data is received via the TDO pin (e.g., one of the communication pins 310) of the testing interface 202. The resulting test data may be communicated as part of a downstream signal between SIBs (e.g., the SIBs 320, 322, and/or 324 of FIG. 3) and to the TDO pin of the tap controller 210. Further, in one or more examples, the resulting test data is communicated between two or more semiconductor devices (e.g., two or more of the semiconductor devices 102-118 of FIG. 1) and to the test device 130 via the communication pin 121.

The test data is spliced into data provided to the memory elements under test. For example, the scan circuitry 950 adds the test data to the upstream signal 931. Start and stop markers are added to the test data to identify the set of memory elements under test.

The test device 130 identifies the starting and ending markers to identify the resulting test data corresponding to set of memory elements under test (e.g., the segments 1021). The test device 130 compares the received test data to the expected test data (e.g., test data communicated to the memory elements under test). If the received resulting test data matches the expected test data, no errors (e.g., bugs or faults) within the memory elements under test are detected. If the received test data does not match the expected test data, errors (e.g., bugs or faults) within the memory elements under test are detected. The detected errors may be output for a user to review. For example, the detected errors may be presented on a display device connected to the test device 130 or printed by a printing device connected to the test device 130.

Examples described herein provide for a debugging various different types of semiconductor device designs via a testing interface (e.g., an internal Joint Test Action Group (iJTAG) interface). The testing interface communicates with the semiconductor device while the semiconductor device is mounted on a circuit board. For example, the testing interface communicates test data to and from elements of the semiconductor device. Further, employing the testing interface to communicate with the semiconductor device allows for the semiconductor device to be debugged without modification of the field-programmable gate array (FPGA) and/or requiring access to unavailable chip-level pins.

While the foregoing is directed to specific examples, other and further examples may be devised without departing from the basic scope thereof, and the scope thereof is determined by the claims that follow.

What is claimed is:

1. A semiconductor device comprising:
a plurality of memory elements;
test control circuitry configured to:
receive clock identification signals, a test mode signal, and a first clock signal, each of the clock identification signals is associated with a memory element clock signal of a respective one of the plurality of memory elements;
generate an intermediate signal based on a determination that the memory element clock signals associated with the memory elements have been stopped by comparing the clock identification signals with each other;
delay the intermediate signal with one or more delays to generate a stop clock signal;
generate a scan clock signal based on the stop clock signal, the test mode signal, and the first clock signal; and
communicate the scan clock signal to the memory elements; and
a testing interface configured to communicate test data from the memory elements.

2. The semiconductor device of claim 1, wherein the test control circuitry is configured to generate the scan clock signal by gating the first clock signal.

3. The semiconductor device of claim 2, wherein the testing interface is further configured to detect a falling edge of the first clock signal, and generate the scan clock signal based on the detection of the falling edge of the first clock signal.

4. The semiconductor device of claim 1, wherein the test data is communicated as part of a control signal.

5. The semiconductor device of claim 1, wherein the test data includes a start marker and an end marker, and wherein the start marker indicates a first memory element of a scan chain and the end marker indicates a last memory element of the scan chain.

6. An electronic device comprising:
a circuit board comprising communication pins; and
a semiconductor device mounted to the circuit board, the semiconductor device communicatively coupled to the communication pins, wherein the semiconductor device comprises:
a plurality of memory elements;
test control circuitry configured to:
receive clock identification signals, a test mode signal, and a first clock signal, each of the clock identification signals is associated with a memory element clock signal of a respective one of the plurality of memory elements;
generate an intermediate signal based on a determination that the memory element clock signals associated with the memory elements have been stopped by comparing the clock identification signals with each other;
delay the intermediate signal with one or more delays to generate a stop clock signal;
generate a scan clock signal based on the stop clock signal, the test mode signal, and the first clock signal; and
communicate the scan clock signal to the memory elements; and
a testing interface configured to communicate test data from the memory elements.

7. The electronic device of claim 6, wherein the test control circuitry is configured to generate the scan clock signal by gating the first clock signal.

8. The electronic device of claim 7, wherein the testing interface is further configured to detect a falling edge of the first clock signal, and generate the scan clock signal based on the detection of the falling edge of the first clock signal.

9. The electronic device of claim 6, wherein the test data is communicated as part of a control signal.

10. The electronic device of claim 6, wherein the test data includes a start marker and an end marker, and wherein the start marker indicates a first memory element of a scan chain and the end marker indicates a last memory element of the scan chain.

11. The electronic device of claim 6, wherein a test device is communicatively coupled to the semiconductor device via the communication pins, and wherein the test device is configured to communicate the test data to and from the semiconductor device.

12. A method for testing a semiconductor device, the method comprising:
receiving clock identification signals, a test mode signal, and a first clock signal, each of the clock identification signals is associated with a memory element clock signal of a respective one of a plurality of memory elements;
generating an intermediate signal based on a determination that the memory element clock signals associated with memory elements have been stopped by comparing the clock identification signals with each other;
delaying the intermediate signal with one or more delays to generate a stop clock signal;
generating a scan clock signal based on the stop clock signal, the test mode signal, and the first clock signal;

communicating the scan clock signal to the memory elements; and communicating test data from the memory elements.

13. The method of claim 12 further comprising generating the scan clock signal by gating the first clock signal.

14. The method of claim 13 further comprising:

detecting a falling edge of the first clock signal; and generating the scan clock signal based the detection of the falling edge of the first clock signal.

15. The method of claim 12, wherein the test data is communicated as part of a control signal.

16. The method of claim 12 further comprising adding a start marker and an end marker are to the test data, and wherein the start marker indicates a first memory element of a scan chain and the end marker indicates a last memory element of the scan chain.

* * * * *